Nov. 19, 1957 J. SPANOS 2,813,782
METHOD OF MASKING DURING SEMICONDUCTOR ETCHING
Filed Feb. 7, 1956
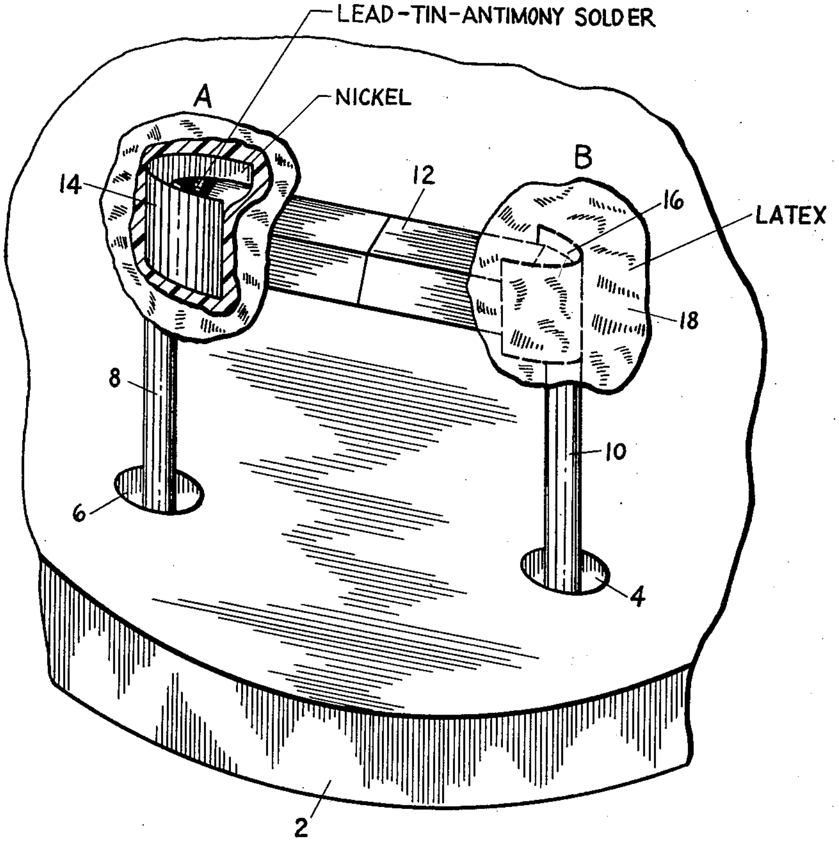
INVENTOR.
JOHN SPANOS
BY George Sipkin
Lee I. Huntzberger
ATTORNEYS 2,813,782

METHOD OF MASKING DURING SEMICONDUCTOR ETCHING

John Spanos, Billerica, Mass., assignor, by mesne assignments, to the United States of America as represented by the Secretary of the Navy Application February 7, 1956, Serial No. 564,094

4 Claims. (Cl. 41—43)

This invention relates to the preparation of semiconductor bodies intended for use in translating devices and more particularly, to a method of protecting portions of such devices from the corrosive effects of powerful etches during the subjection of the semiconductor body to such etch.

The preparation of semiconductor translating devices generally including a semiconductor body consisting of material such as germanium or silicon wherein the devices may be diodes or transistors, it very often becomes necessary to subject particular portions of the devices to extremely powerful and corrosive etches. For example, a typical etching solution for this purpose is set forth in U. S. Patent No. 2,656,496 to Morgan Sparks, issued October 20, 1953, and comprises 100 milliliters of hydrofluoric acid, 48%, 100 milliliters of glacial acetic acid, 200 milliliters of concentrated nitric acid, and 0.3 milliliter of bromine. Such a solution readily dissolves germanium and silicon. In a junction semiconductor device, i. e., one having contiguous p and n-type zones with a barrier junction therebetween, its leads were first soldered to its component zones and then if it were desired to etch the surface of the semiconductor body, the metals comprising the device such as the solder metal and the metal comprising the leads must be protected from the etching solution. Otherwise, these metals would be attacked much more rapidly than the germanium, silicon, or other semiconductive material, comprising the semiconductor body so that the resultant products would also contribute to the surface staining of the semiconductor body resulting in electrical deterioration. To prevent these serious and deleterious effects, it is desirable to isolate these other metals and to expose only the semiconductor body to the action of the etching solution.

Heretofore, several classes of materials have been used as a protective masking material for the isolation of the other metals as set forth hereinabove. The general classes of plastics such as polystyrene, waxes such as paraffin, and some rubber silicon co-polymers. Plastics are generally applied and polymerized in position and after the etching step are dissolved by suitable solvents. Waxes such as paraffin are melted, applied in the liquid state, permitted to solidify, and then dissolved away at the completion of the etching. The rubber silicone co-polymers are generally in a solvent and upon application, the solvent evaporates, leaving behind the gum-like rubber silicone co-polymer.

The use of these materials as masking substitutes has presented many disadvantages. For example, the plastics are quite difficult to remove and their use is time consuming. The waxes are extremely difficult to dissolve and to clean off completely to the degree of chemical cleanliness required in semiconductor translating device fabrication. The rubber silicone co-polymer is undesirable in that after immersion in the etching solution that is used, it becomes quite hard and its removal is very difficult. In addition, in connection with the latter material, the solvent therefor which is generally methyl-ethyl-ketone has deleterious effects on the operation of a junction device.

It is, accordingly, the primary object of the present invention to provide a method for protecting the other portions of a semiconductor translating device during the etching of the semiconductor body thereof.

It is a further object to provide a method as set forth in the preceding object wherein no undesirable solvents are introduced in the protecting step which deleteriously effect the surface of the semiconductor body.

Another object is to provide a method for protecting the parts other than the semiconductor body in a semiconductor translating device during the etching of said body wherein the protectant material is facilely applied and the normal period for such application is relatively short.

Another object is to provide a method for protecting the non-semiconductor elements of a semiconductor translating device during the etching of the semiconductor body wherein the protectant material used is readily removed at the completion of the etching.

In accordance with the present invention, there is provided a method of protecting the regions of a semiconductor translating device that are to be isolated from the etching solution which comprises applying latex to the regions to be isolated followed by a dip in acetic acid to coagulate the latex.

Other objects and many of the attendant advantages of this invention will be readily appreciated as the same becomes better understood by reference to the following detailed description when considered in connection with the accompanying drawing wherein:

The sole figure illustrates the arrangement utilized in carrying out the method of the present invention.

Referring now to the drawing, there is shown the assembled semiconductor translating device prior to the application of the etching solution. A base 2 consisting of a suitable material such as Bakelite has two openings therethrough 4 and 6 for receiving the upright lead wires 8 and 10 from the semiconductor body 12. These wires generally consist of a metal such as nickel and the semiconductor device may be a silicon or germanium junction device. The ends of the lead wires have been soldered with a suitable material such as lead-tin-antimony solder to the end of the silicon or germanium body 12. Surrounding the soldered junction and also affixed thereto by the aforementioned solder are tabs 14 and 16. The latex coating 18 which has been applied by dipping or spraying the areas designated as A and B with latex, completely covers the tabs and the solder junction effectively, and only the semiconductor body has been exposed for etching thereof.

By dipping or applying pure latex to the regions to be isolated from the etch followed by a dip in acetic acid to coagulate the latex good protection is obtained for the semiconductor body etching. The normal period of such application does not exceed five minutes and ease of application is gained as well as speed. Approximately two to three minutes are sufficient for the setting. No undesirable solvents are introduced and good surface binding is obtained. In the event that the etching solution used contains nitric acid, the latter swells the latex sufficiently during the etching period to permit very convenient removal thereafterward. The latex remains quite soft and does not require excessive force for removal say, as for example, in the case of the rubber silicone co-polymer. Since the etching solution invariably contains acetic acid, the use thereof as a coagulant is also completely compatible.

Obviously many modifications and variations of the present invention are possible in the light of the above teachings. It is therefore to be understood that within the scope of the appended claims the invention may be practiced otherwise than as specifically described.

I claim:

1. In the process of etching the semiconductor body of a semiconductor translating device wherein the etching solution comprises nitric and acetic acids and the device includes leads and solder metal securing the leads to the semiconductor body and wherein the leads and solder metal are more readily attacked by the etching solution than the semiconductor body, the method of isolating regions of said device including the leads and the solder metal from the corrosive effects of the etching solution comprising the steps of dipping the regions to be isolated in pure liquid latex for a short period and thereafter dipping the regions in acetic acid to coagulate the latex, and applying the etching solution; whereby the nitric acid in the etching solution swells the latex sufficiently during the etching period to permit convenient removal thereof.

2. In the process of etching the semiconductor body of a semiconductor translating device wherein the etching solution comprises nitric and acetic acids and the device includes leads and solder metal securing the leads to the semiconductor body and wherein the leads and solder metal are more readily attacked by the etching solution than the semiconductor body, the method of isolating regions of said device including the leads and the solder metal from the corrosive effects of the etching solution comprising the steps of coating the regions to be isolated in pure liquid latex for a short period and thereafter dipping the regions in acetic acid to coagulate the latex, and applying the etching solution; whereby the nitric acid in the etching solution swells the latex sufficiently during the etching period to permit convenient removal thereof.

3. In the process of etching the semiconductor body of a semiconductor translating device wherein the etching solution comprises nitric and acetic acids and the device includes leads and solder metal securing the leads to the semiconductor body and wherein the leads and solder metal are more readily attacked by the etching solution than the semiconductor body, the method of isolating regions of said device including the leads and the solder metal from the corrosive effects of the etching solution comprising the steps of spraying the regions to be isolated with pure liquid latex for a short period and thereafter dipping the regions in acetic acid to coagulate the latex, and applying the etching solution; whereby the nitric acid in the etching solution swells the latex sufficiently during the etching period to permit convenient removal thereof.

4. In a method of etching a portion of a semiconductor translating device with a corrosive etching solution and protecting the remainder of said device from corrosion by said etching solution; comprising the steps of coating said remainder of said device with latex, applying acetic acid to the latex coating to coagulate it, wetting said device protected in part by said coagulated latex with said etching solution for a predetermined period, separating said device and said etching solution, and physically separating said coagulated latex and said device.

References Cited in the file of this patent

UNITED STATES PATENTS

| | | |
|---|---|---|
| 1,609,806 | Fisher | Dec. 7, 1926 |
| 2,293,928 | Beal | Aug. 25, 1942 |
| 2,726,924 | Rumbold | Dec. 13, 1955 |
| 2,739,047 | Sanz | Mar. 20, 1956 |